United States Patent
Arimatsu

(10) Patent No.: US 9,065,037 B2
(45) Date of Patent: Jun. 23, 2015

(54) PIEZOELECTRIC VIBRATING PIECE, PIEZOELECTRIC VIBRATOR, OSCILLATOR, ELECTRONIC DEVICE, AND RADIO-CONTROLLED TIMEPIECE

(71) Applicant: Seiko Instruments Inc., Chiba (JP)

(72) Inventor: Daishi Arimatsu, Chiba (JP)

(73) Assignee: SII CRYSTAL TECHNOLOGY INC., Chiba (JP)

( * ) Notice: Subject to any disclaimer, the term of this patent is extended or adjusted under 35 U.S.C. 154(b) by 333 days.

(21) Appl. No.: 13/837,097

(22) Filed: Mar. 15, 2013

(65) Prior Publication Data

US 2013/0242710 A1    Sep. 19, 2013

(30) Foreign Application Priority Data

Mar. 19, 2012  (JP) ................. 2012-062520

(51) Int. Cl.
  *H03H 9/21* (2006.01)
  *H01L 41/047* (2006.01)
  *H03B 1/00* (2006.01)
  *G04R 60/00* (2013.01)
  *H03H 9/13* (2006.01)
  *H03H 9/10* (2006.01)
  *H03H 3/02* (2006.01)

(52) U.S. Cl.
  CPC ........ *H01L 41/0475* (2013.01); *H01L 41/0477* (2013.01); *H03B 1/00* (2013.01); *G04R 60/00* (2013.01); *H03H 9/132* (2013.01); *H03H 9/1007* (2013.01); *H03H 9/21* (2013.01); *H03H 2003/026* (2013.01)

(58) Field of Classification Search
  CPC ........................................... H03H 9/21
  USPC ........................................... 310/370
  See application file for complete search history.

(56) References Cited

U.S. PATENT DOCUMENTS

| 4,377,765 | A  | * | 3/1983 | Kogure et al. | 310/312 |
| 7,764,145 | B2 | * | 7/2010 | Iwai | 333/200 |
| 2009/0126488 | A1 | * | 5/2009 | Fujimoto et al. | 73/504.16 |
| 2009/0167118 | A1 | * | 7/2009 | Yoshimatsu et al. | 310/370 |
| 2012/0049695 | A1 | * | 3/2012 | Ichikawa | 310/344 |
| 2013/0249352 | A1 | * | 9/2013 | Arimatsu | 310/366 |

FOREIGN PATENT DOCUMENTS

| JP | 09-326668 A | | 12/1997 |
| JP | 2008061039 A | * | 3/2008 |
| JP | 2008085743 A | * | 4/2008 |
| JP | 2008085957 A | * | 4/2008 |
| JP | 2009152989 A | * | 7/2009 |

* cited by examiner

*Primary Examiner* — J. San Martin
(74) *Attorney, Agent, or Firm* — Brinks Gilson & Lione

(57) ABSTRACT

There is provided a piezoelectric vibrating piece including: a piezoelectric plate that includes a pair of vibrating arm portions, and a base portion which integrally fixes the base end portions of the pair of vibrating arm portions along a length direction; excitation electrodes which are formed on the vibrating arm portions and vibrate the vibrating arm portions; mounting electrodes which are formed on the base portion and mount the piezoelectric plate on external portions using a joining member; and leading-out electrodes which connect the excitation electrodes and the mounting electrodes, in which the leading-out electrodes are formed by folding back several times between the excitation electrodes and the mounting electrodes.

7 Claims, 14 Drawing Sheets

PIEZOELECTRIC VIBRATING PIECE, PIEZOELECTRIC VIBRATOR, OSCILLATOR, ELECTRONIC DEVICE, AND RADIO-CONTROLLED TIMEPIECE

RELATED APPLICATIONS

This application claims priority under 35 U.S.C. §119 to Japanese Patent Application No. 2012-062520 filed on Mar. 19, 2012, the entire content of which is hereby incorporated by reference.

BACKGROUND OF THE INVENTION

1. Field of the Invention

The present invention relates to a piezoelectric vibrating piece, a piezoelectric vibrator, an oscillator, an electronic device, and a radio-controlled timepiece.

2. Description of the Related Art

In recent years, in mobile phones or personal digital assistants, a piezoelectric vibrator using a crystal or the like as a time source, a timing source of a control signal or a reference signal source, and the like has been used. Various piezoelectric vibrators of this kind have been provided, and a piezoelectric vibrator including a tuning fork type piezoelectric vibrating piece has been known as one example thereof.

The piezoelectric vibrator includes the tuning fork type piezoelectric vibrating piece described above, a plug, a case which hermetically seals the plug and the piezoelectric vibrating piece. The plug includes a pair of inner leads in which the piezoelectric vibrating piece is mounted, a plug main body which holds the inner leads. In addition, as shown in FIG. 15A, the piezoelectric vibrating piece 200 includes a pair of vibrating arm portions 211 which are disposed in parallel with a width direction, a base portion 212 which integrally fixes the base end portions of the pair of vibrating arm portions 211 in a length direction, a pair of excitation electrodes 213 which are formed on the vibrating arm portions 211 and vibrate the vibrating arm portions 211 when a predetermined driving voltage is applied, a mounting electrode 214 which is formed on the base portion 212 and is electrically connected to the pair of excitation electrodes 213 respectively, and a leading-out electrode 215 which connects the excitation electrodes 213 and the mounting electrode 214.

In addition, the pair of excitation electrodes 213, the mounting electrode 214, and the leading-out electrode 215 are an electrode layer 210 which is formed by laminating an underlying metal layer 210a (see FIGS. 16A and 16B) which is formed of chromium or the like, and a finishing metal layer 210b which is formed of gold or the like.

JP-A-9-326668 discloses a configuration in which the inner leads and the mounting electrode 214 are joined to each other through a joining member E', such as solder, when mounting the piezoelectric vibrating piece 200 described above.

Generally, in order to strongly fix the piezoelectric vibrating piece 200 and the joining member E', a material having high diffusibility with respect to the mounting electrode 214 (finishing metal layer 210b) is selected for the joining member E'. Accordingly, as shown in FIG. 15B, as time elapses, the joining member E' diffuses on the electrode layer 210. This phenomenon significantly occurs when heat is applied to the joining member E', such as in a case of hot-air mounting or the like.

As the diffused joining member E' approaches the vibrating arm portions 211, an effect of a vibrating state (amount of deformation of the piezoelectric vibrating piece 200) becomes significant, and the frequency is shifted. Meanwhile, when a material having low diffusibility with respect to the mounting electrode 214 is used for the joining member E', sufficient fixing strength is not obtained between the piezoelectric vibrating piece 200 and the joining member E', and there is a concern that the piezoelectric vibrating piece 200 may separate from the joining member E'.

Thus, for example, as shown in FIG. 16A, a configuration is considered in which the finishing metal layer 210b in a portion (leading-out electrode 215 or excitation electrodes 213) other than the mounting electrode 214 from the electrode layer 210 of the piezoelectric vibrating piece 200 is removed to expose the underlying metal layer 210a. According to the configuration, as shown in FIG. 16B, since the diffusibility of the joining member E' decreases in a portion other than the mounting electrode 214, it is possible to prevent diffusion of the joining member E' to a portion other than the mounting electrode 214 while strongly fixing the piezoelectric vibrating piece 200 and the joining member E'.

However, in the configuration described above, it is necessary to pattern only the finishing metal layer 210b to expose the underlying metal layer 210a after collectively patterning the finishing metal layer 210b and the underlying metal layer 210a. Thus, it is problem in that the number of manufacturing processes and manufacturing costs increase.

SUMMARY OF THE INVENTION

An object of the present invention is to provide a piezoelectric vibrating piece, a piezoelectric vibrator, an oscillator, an electronic device, and a radio-controlled timepiece in which diffusion of a joining member can be suppressed while suppressing increases of the number of manufacturing processes and cost.

According to an aspect of the invention, there is provided a piezoelectric vibrating piece including: a piezoelectric plate that includes a pair of vibrating arm portions, and a base portion which integrally fixes the base end portions of the pair of vibrating arm portions along a length direction; excitation electrodes which are formed on the vibrating arm portions and vibrate the vibrating arm portions; mounting electrodes which are formed on the base portion and mount the piezoelectric plate on an external portion using a joining member; and leading-out electrodes which connect the excitation electrodes and the mounting electrodes, in which the leading-out electrodes are formed by folding back several times between the excitation electrodes and the mounting electrodes.

According to the configuration, since the leading-out electrodes are formed to be folded between the excitation electrodes and the mounting electrodes, it is possible to extend a distance of the leading-out electrodes compared to a case of forming the leading-out electrodes linearly between the excitation electrodes and the mounting electrodes. Accordingly, even in a case where a material having high diffusibility on the mounting electrodes is used for the joining member, it is possible to suppress the diffusion of the joining member to the vibrating arm portion side.

In this case, since it is not necessary to pattern the electrode layer several times, for example removing the electrode layer in a portion other than the mounting electrodes as in the related art, it is possible to suppress the diffusion of the joining member while suppressing the increases of the number of manufacturing processes and the cost thereof. As a result, since the piezoelectric vibrating piece can be strongly fixed while suppressing a fluctuation of a vibration frequency, it is possible to provide a piezoelectric vibrating piece with an excellent vibration property and high reliability.

It is preferable that the leading-out electrodes be formed by meandering along a surface direction of the piezoelectric plate.

According to this configuration, the patterning of the leading-out electrodes can be easily performed at the same time as the patterning of other electrode layers.

It is preferable that, in a formation region of the leading-out electrodes along the length direction from the piezoelectric plate, a cut-out portion which is opened in a thickness direction of the piezoelectric plate be formed along the thickness direction, and the leading-out electrodes be folded back along the thickness direction on the inner surface of the cut-out portion.

According to the configuration, since the cut-out portion is formed on the base portion, and it is possible to make a route through which the vibration excited by the vibrating arm portions propagates to the base portion side narrow, with a narrow width portion formed with the cut-out portion, the vibration is kept in the vibrating arm portion side to easily suppress a leakage thereof to the base portion side. Accordingly, it is possible to effectively suppress vibration leakage, to suppress an increase of a CI value, and to suppress a decrease of quality of an output signal.

In addition, since the leading-out electrodes are formed in the inner surface of the cut-out portion, and it is possible to extend a distance of the leading-out electrodes compared to a case of forming the leading-out electrodes linearly between the excitation electrodes and the mounting electrodes, it is possible to suppress the diffusion of the joining member to the vibrating arm portion side.

It is preferable that the mounting electrodes be formed of gold, and the joining member be formed of solder.

According to the configuration, since the joining member is appropriately diffused on the mounting electrodes, it is possible to strongly fix the piezoelectric vibrating piece and the joining member.

According to another aspect of the invention, there is provided a piezoelectric vibrator according to the present invention including the piezoelectric vibrating piece of the present invention, in which the mounting electrodes of the piezoelectric vibrating piece are mounted on a package using the joining member.

According to the configuration, since it is possible to suppress the diffusion of the joining member and to strongly fix the piezoelectric vibrating piece while suppressing increases of the number of manufacturing processes and cost thereof, it is possible to provide a piezoelectric vibrator with excellent vibration characteristics and high reliability.

According to another aspect of the invention, there is provided an oscillator according to the present invention in which the piezoelectric vibrator of the present invention is electrically connected to an integrated circuit as an oscillating piece.

According to another aspect of the invention, there is provided an electronic device according to the present invention, in which the piezoelectric vibrator of the present invention is electrically connected to a counter portion.

According to another aspect of the invention, there is provided a radio-controlled timepiece according to the present invention, in which the piezoelectric vibrator of the present invention is electrically connected to a filter portion.

Since the oscillator, the electronic device, and the radio-controlled timepiece according to the present invention include the piezoelectric vibrator of the present invention, it is possible to provide a product with excellent characteristics and reliability.

According to the piezoelectric vibrating piece and the piezoelectric vibrator of the present invention, it is possible to suppress the diffusion of the joining member while suppressing the increases of the number of manufacturing processes and the cost thereof. Since the piezoelectric vibrating piece can be strongly fixed while suppressing the fluctuation of the vibration frequency, it is possible to provide a piezoelectric vibrating piece and a piezoelectric vibrator with excellent vibration characteristics and high reliability.

Since the oscillator, the electrode device and the radio-controlled timepiece according to the present invention include the piezoelectric vibrator of the present invention, it is possible to provide a product with excellent characteristics and reliability.

BRIEF DESCRIPTION OF THE DRAWINGS

FIGS. 14A and 14B are views showing another configuration of a piezoelectric vibrating piece, in which FIG. 14A is an enlarged plan view of a base portion and FIG. 14B is a side view of the base portion.

DETAILED DESCRIPTION OF THE PREFERRED EMBODIMENTS

Next, embodiments of the present invention will be described with reference to the drawings.

Piezoelectric Vibrator

Figure 1:
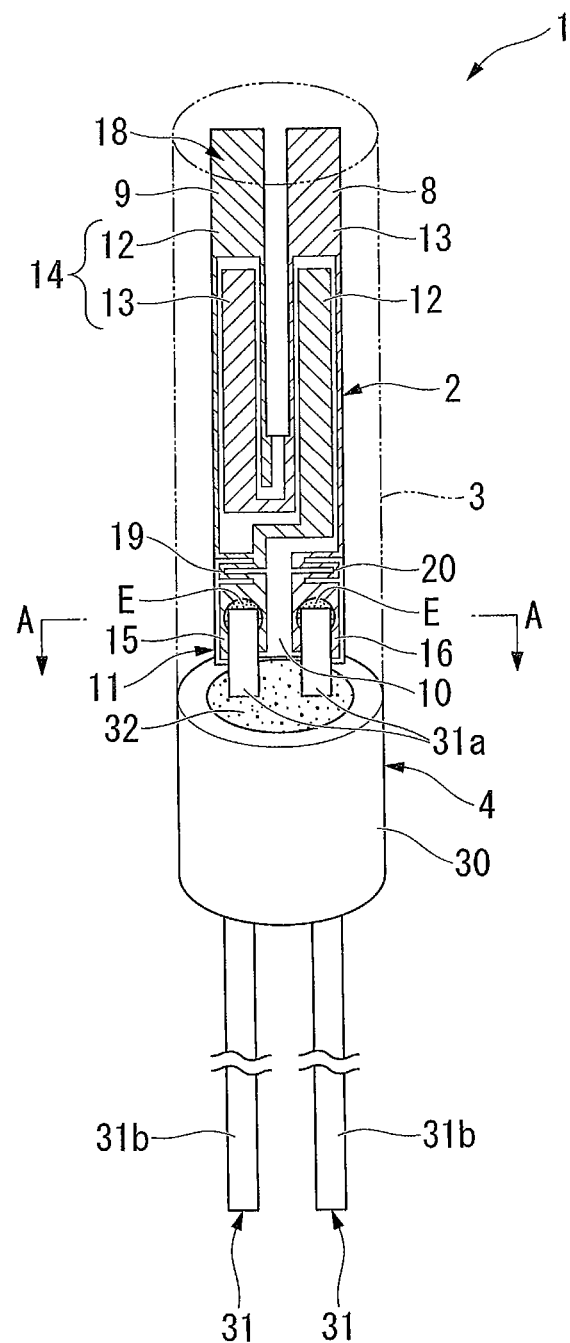
FIG. 1 is a perspective view of an exterior of a piezoelectric vibrator of an embodiment of the present invention.

FIG. 1 is a perspective view of a piezoelectric vibrator according to the present embodiment.

As shown in FIG. 1, a piezoelectric vibrator 1 is a cylinder-packaged piezoelectric vibrator, and includes a tuning fork type piezoelectric vibrating piece 2, a plug (package) 4 in which the piezoelectric vibrating piece 2 is mounted, and a case (package) 3 which hermetically seals the plug 4 and the piezoelectric vibrating piece 2.

Piezoelectric Vibrating Piece

Figure 2:
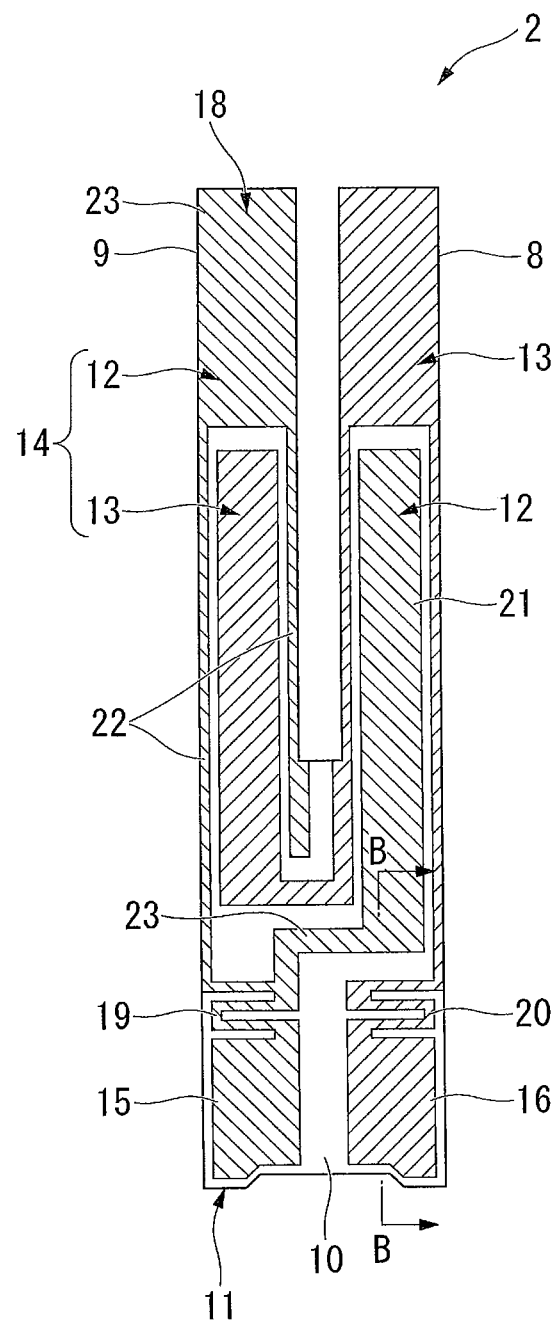
FIG. 2 is a plan view (top view) of a piezoelectric vibrating piece seen from one main surface side.
Figure 3:
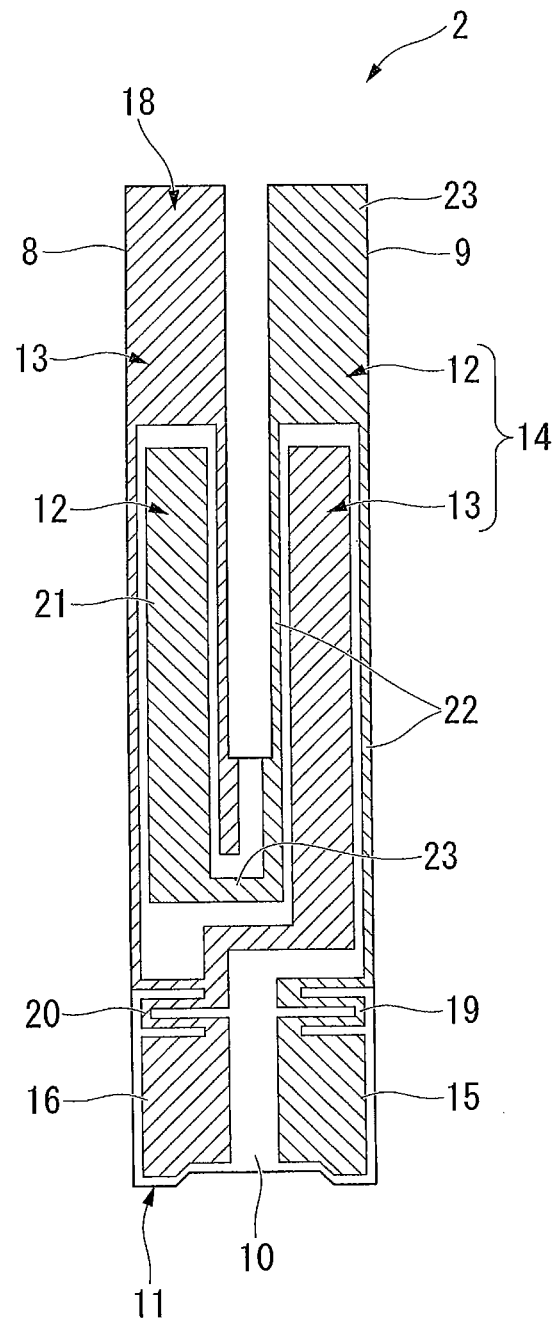
FIG. 3 is a plan view (bottom view) of a piezoelectric vibrating piece seen from another main surface side.

FIG. 2 is a plan view (top view) of a piezoelectric vibrating piece seen from one main surface side, and FIG. 3 is a plan view (bottom view) of the piezoelectric vibrating piece seen from another main surface side. In addition, FIG. 4 is a side view of the piezoelectric vibrating piece.

Figure 4:
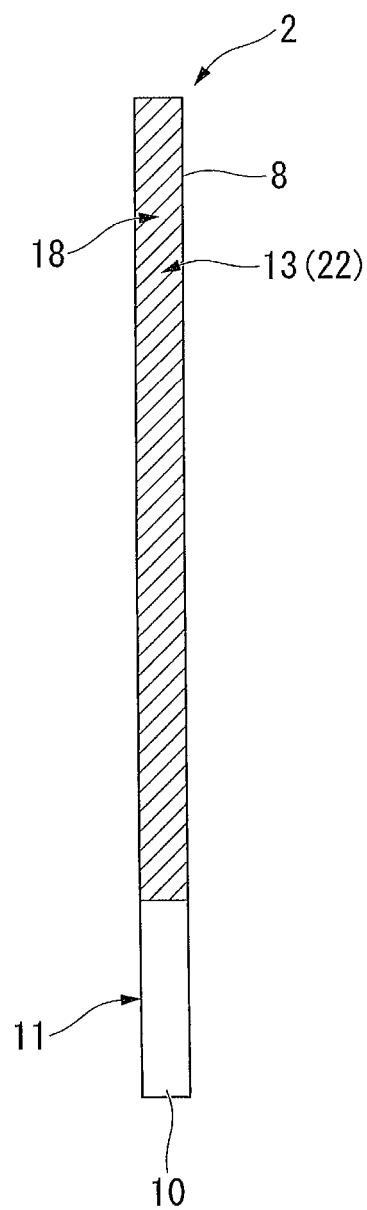
FIG. 4 is a side view of a piezoelectric vibrating piece.

As shown in FIGS. 2 to 4, the piezoelectric vibrating piece 2 is a tuning fork type vibrating piece which is formed of a piezoelectric material such as crystal, lithium tantalite, lithium niobate, or the like, and vibrates when predetermined voltage is applied.

The piezoelectric vibrating piece 2 includes a piezoelectric plate 11 including a pair of vibrating arm portions 8 and 9 which are disposed in parallel with each other in a width direction and a base portion 10 which integrally fixes base end portions of the pair of vibrating arm portions 8 and 9, and an electrode layer 18 which is formed on the piezoelectric plate 11. In the description hereinafter, from a surface direction of the piezoelectric plate 11, an extending direction of the vibrating arm portions 8 and 9 is simply referred to as a length direction, a side of the vibrating arm portions 8 and 9 and a side of the base portion 10 along the length direction are simply referred to as a distal end side and a base end side, respectively, an arranged direction of the vibrating arm portions 8 and 9 is simply referred to as a width direction, and a thickness direction of the piezoelectric plate 11 is simply referred to as a thickness direction.

Figure 5:
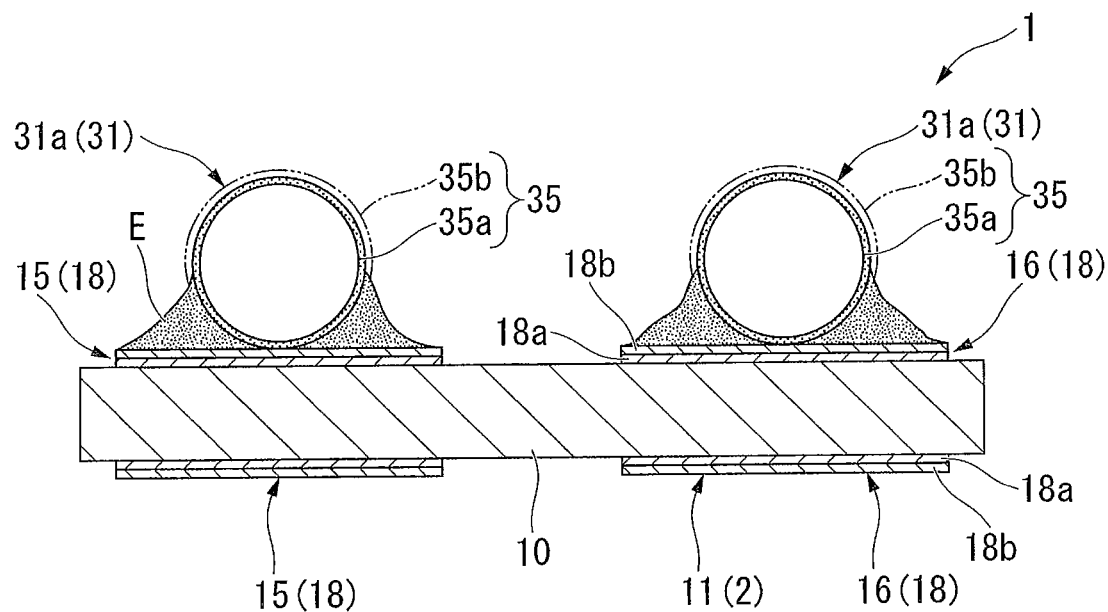
FIG. 5 is a cross-sectional view taken along line A-A of FIG. 1.

FIG. 5 is a cross-sectional view taken along line A-A of FIG. 1.

As shown in FIG. 5, the electrode layer 18 vibrates the pair of vibrating arm portions 8 and 9 when predetermined voltage is applied, and is configured by laminating an underlying metal layer 18a formed of chromium (Cr) or the like, and a finishing metal layer 18b formed of gold (Au) or the like, in order.

The underlying metal layer 18a is provided for improving adhesiveness of the finishing metal layer 18b and the piezoelectric plate 11, and is formed so as to be interposed between the piezoelectric plate 11 and the finishing metal layer 18b. The finishing metal layer 18b is formed so as to cover the underlying metal layer 18a with the same pattern as the underlying metal layer 18a.

In detail, as shown in FIGS. 2 to 4, the electrode layer 18 includes excitation electrodes 14 which include first excitation electrodes 12 and second excitation electrodes 13 which are formed on the outer surface of the pair of vibrating arm portions 8 and 9 and vibrate the pair of vibrating arm portions 8 and 9, mounting electrodes 15 and 16 which are formed on the base portion 10 and mount the piezoelectric vibrating piece 2 using a joining member E which will be described later, and leading-out electrodes 19 and 20 which connect the first excitation electrodes 12 and the second excitation electrodes 13, and the mounting electrodes 15 and 16, respectively.

The excitation electrodes 14 are electrodes which vibrate the pair of vibrating arm portions 8 and 9 with a predetermined resonance frequency in an approaching direction or a separating direction to and from each other, and are formed by patterning on the outer surface of the pair of vibrating arm portions 8 and 9 in a state of being electrically disconnected from each other. In detail, the first excitation electrodes 12 are mainly formed on the base end portions of both main surfaces of the vibrating arm portion 8, on the distal end portions of both main surfaces of the vibrating arm portion 9, and on both side surfaces of the vibrating arm portion 9. Meanwhile, the second excitation electrodes 13 are mainly formed on the distal end portions of both main surfaces of the vibrating arm portion 8, both side surfaces of the vibrating arm portion 8, and the base end portions of both main surfaces of the vibrating arm portion 9.

Herein, the excitation electrodes 12 and 13 described above will be described in detail.

As shown in FIGS. 2 to 4, the excitation electrodes 12 and 13 of the embodiment include a main surface electrode portion 21, side surface electrode portions 22, and a connection electrode portion 23, respectively. Since each of the excitation electrodes 12 and 13 passes the center of piezoelectric plate 11 in the width direction and is formed to be symmetrical with respect to a point around an axis of symmetry which extends along the length direction, in the description hereinafter, the first excitation electrodes 12 will be described from the excitation electrodes 12 and 13, and the description of the second excitation electrodes 13 will be omitted.

The main surface electrode portion 21 is continuously formed over the distal end portion of the base portion 10, and the base end portion of the vibrating arm portion 8, and is formed in a rectangular shape having a narrow width with respect to the vibrating arm portion 8 in a plan view.

The side surface electrode portions 22 are formed in a position which is other than the base end portion of the base portion 10 from the side surface of the piezoelectric plate 11. In detail, the side surface electrode portions 22 are formed over all of both side surfaces of the vibrating arm portion 9 in the length direction, and is formed on the distal end portion of the side surface of the vibrating arm portion 9 of the base portion 10.

The connection electrode portion 23 connects the distal end portions of the side surface electrode portions 22 to each other in the distal end portion of the vibrating arm portion 9, and connects the base end portions of the side surface electrode portions 22 and the main surface electrode portion 21 to each other on the main surfaces of the base portion 10. In detail, the connection electrode portion 23 connects the side surface electrode portion 22 which is formed on the side surface positioned on the inner side of the vibrating arm portion 9 in the width direction, and the side surface electrode portion 22 which is formed on the side surface positioned on the outer side of the vibrating arm portion 9 in the width direction, to each other, in the distal end portion of the vibrating arm portion 9.

In addition, the connection electrode portion 23 connects the base end portion of the main surface electrode portion 21 and the side surface electrode portion 22 which is formed on the side surface positioned on the outer surface of the vibrating arm portion 9 in the width direction to each other, on one main surface of the base portion 10, and connects the base end portion of the main surface electrode portion 21 and the side surface electrode portion 22 which is formed on the side surface positioned on the inner side of the vibrating arm portion 8 in the width direction to each other, on another main surface.

The mounting electrodes 15 and 16 are formed on the base end portions of both main surfaces from the base portion 10. In this case, as shown in FIGS. 4 and 5, in the embodiment, the electrode layer 18 is not formed on both side surfaces of the base portion 10, and the mounting electrodes 15 and 16 and the leading-out electrodes 19 and 20 are patterned to be formed in a state of being electrically disconnected between both main surfaces of the base portion 10.

Figure 6:
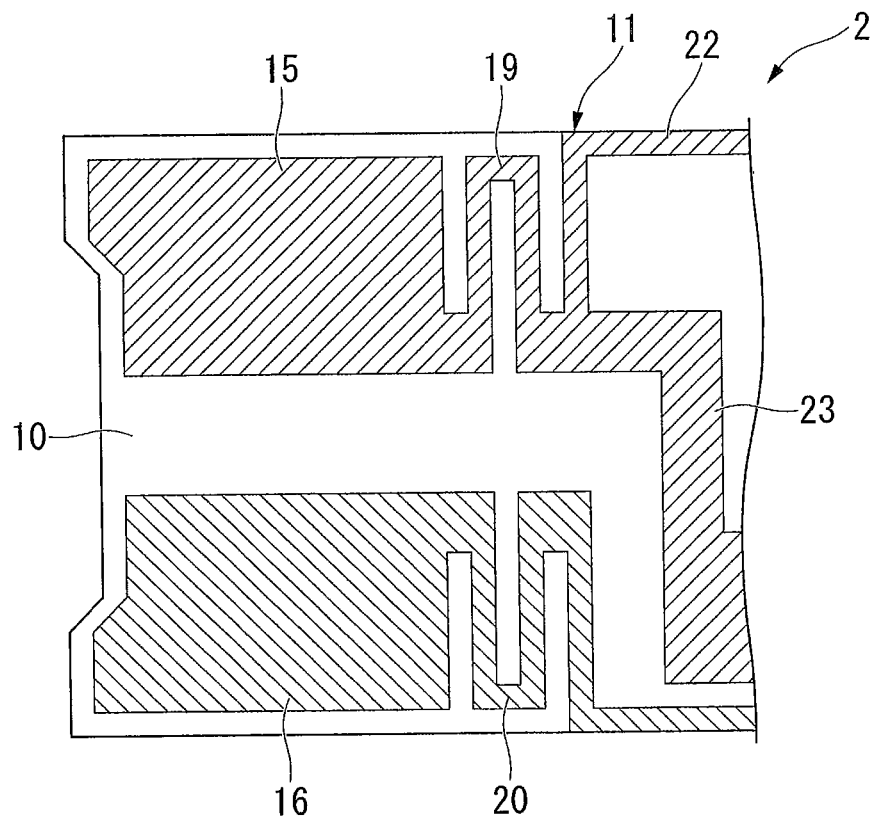
FIG. 6 is an enlarged plan view of a base portion.

FIG. 6 is an enlarged plan view of the base portion.

Herein, as shown in FIG. 6, in the center portion of the base portion 10 along the length direction, the leading-out electrodes 19 and 20 extend along the length direction while meandering along the width direction respectively.

In detail, after extracted from the distal end portion of the mounting electrode 15, the leading-out electrode 19 is folded back several times within the width of the mounting electrode 15 as approaching the distal end side. The distal end portion of the leading-out electrode 19 is connected to the base end portion (the side surface electrode portions 22 or the connection electrode portion 23) of the first excitation electrodes 12.

Meanwhile, after extracted from the distal end portion of the mounting electrode 16, the leading-out electrode 20 is folded back several times within the width of the mounting electrode 16 as approaching the distal end side. The distal end portion of the leading-out electrode 20 is connected to the base end portion (the side surface electrode portions 22 or the connection electrode portion 23) of the second excitation electrodes 13.

In the embodiment, the folded portions of the leading-out electrodes 19 and 20 are portions of which the bending angles are equal to or more than 90°.

As shown in FIG. 1, the case 3 is formed in a bottomed-cylinder shape, and is pressed with respect to the outer periphery of a stem 30, which will be described later, of the plug 4 in a state of being accommodated in the inner portion of the piezoelectric vibrating piece 2, to be fixed in a fit manner. The press fit of the case 3 is performed under vacuum atmosphere, and a space surrounding the piezoelectric vibrating piece 2 in the case 3 is in a state of being vacuumed.

The plug 4 includes the stem 30 which encloses the case 3, two lead terminals 31 which are disposed in parallel with each other so as to penetrate the stem 30, and a filler 32 with an insulation property, which fills the inner side of the stem 30 to fix the stem 30 and the lead terminals 31. The stem 30 is formed in a ring shape with metallic materials. In addition, as a material of the filler 32, borosilicate glass is used, for example.

The portions of the two lead terminals 31 which protrude in the case 3 become the inner leads 31a and the portions thereof which protrude outside the case 3 become the outer leads 31b. The lead terminals 31 have a diameter of about 0.12 mm, for example, and kovar (FeNiCo alloy) is commonly used as a material used for the base material of the lead terminals 31.

As shown in FIG. 5, plated layers 35 are coated on the surfaces of the lead terminals 31 and the outer periphery of the stem 30. As a material for the plated layers for coating the film, copper (Cu) plating or the like is used for an underlying film 35a, and tin lead plating (which is an alloy of tin and lead and has a ratio by weight of 1:9) having a high melting point of about 300 degrees for example is used for a finishing film 35b.

The inner leads 31a and the mounting electrodes 15 and 16 are mounted on the finishing metal layer 18b of the mounting electrodes 15 and 16 using the joining member E which is formed by dissolving the finishing film (tin lead plating with a high melting point) 35b. That is, the inner leads 31a and the mounting electrodes 15 and 16 are mechanically joined to each other through the joining member E, and at the same time, are electrically connected to each other. As a result, the piezoelectric vibrating piece 2 is in a state of being mounted on the two lead terminals 31.

The one end side (side of the outer leads 31b) of the two lead terminals 31 described above is electrically connected to the outer portion, and another end side (side of the inner leads 31a) thereof functions as an external connection terminal which is mounted with respect to the piezoelectric vibrating piece 2.

In addition, since the plated layers 35 are coated on the outer periphery of the stem 30 and perform cold welding on the inner periphery of the case 3 in a vacuum, the inner portion of the case 3 can be hermetically sealed in a vacuum state.

In a case of operating the piezoelectric vibrator 1 configured as described above, predetermined driving voltage is applied with respect to the outer leads 31b of two lead terminals 31. Accordingly, current can flow to the excitation electrodes 14 which are formed of the first excitation electrodes 12 and the second excitation electrodes 13 through the inner leads 31a, the joining member E, the mounting electrodes 15 and 16, and the leading-out electrodes 19 and 20, and it is possible to vibrate the pair of vibrating arm portions 8 and 9 with a predetermined frequency in an approaching direction or a separating direction to and from each other. In addition, it is possible to use as a time source, a timing source and a reference signal source of a control signal, and the like by using the vibration of the pair of vibrating arm portions 8 and 9.

Method of Manufacturing Piezoelectric Vibrator

Figure 7:
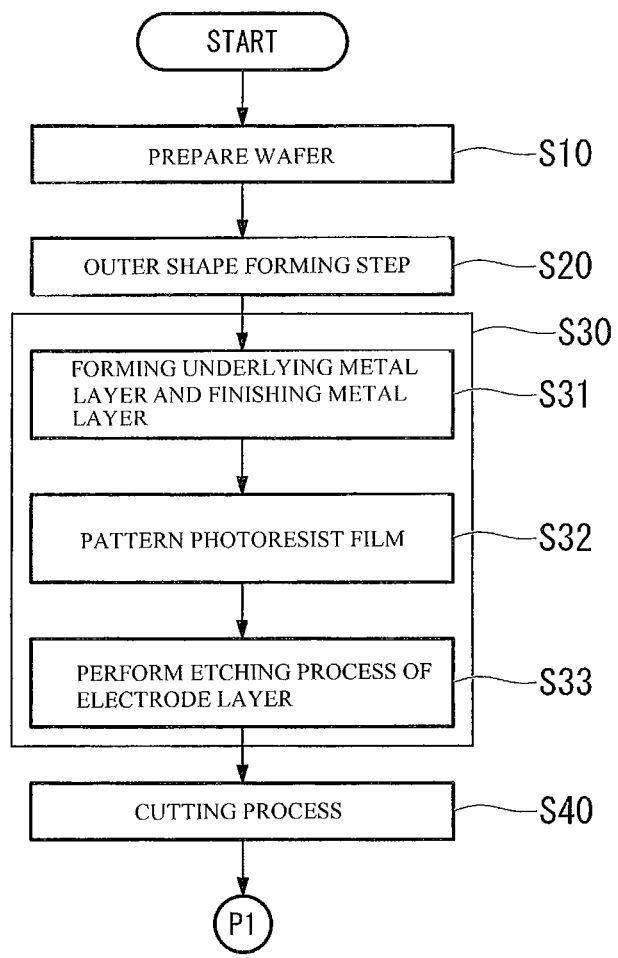
FIG. 7 is a flowchart showing a method of manufacturing a piezoelectric vibrator.
Figure 8:
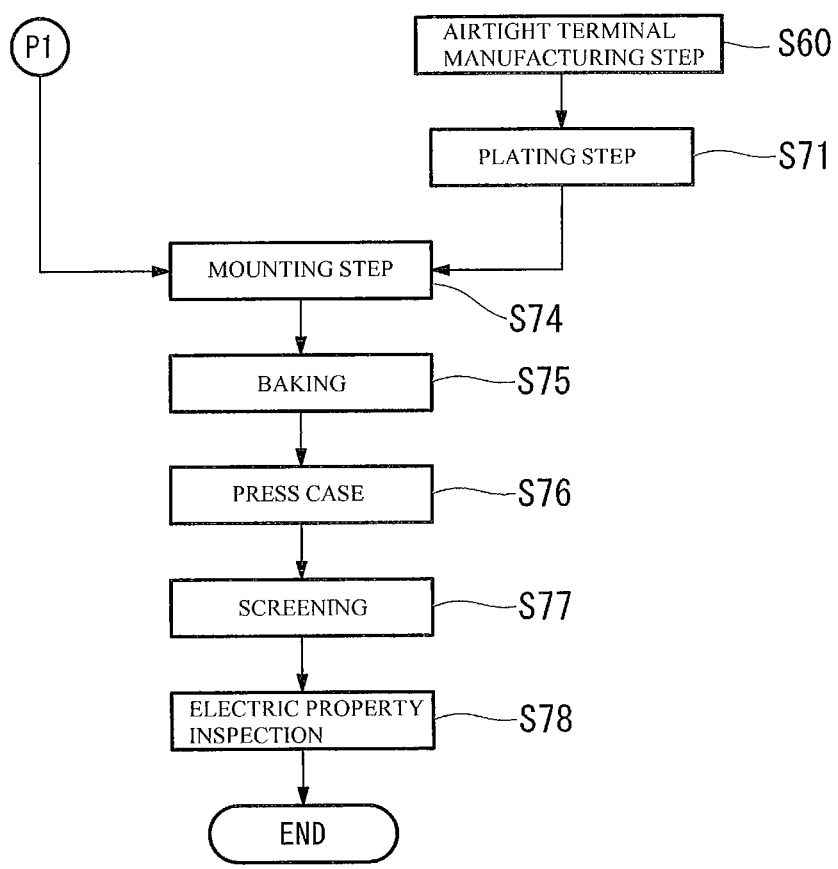
FIG. 8 is a flowchart showing a method of manufacturing a piezoelectric vibrator.

Next, a method of manufacturing the piezoelectric vibrator described above will be described. FIGS. 7 and 8 are flowcharts showing a method of manufacturing the piezoelectric vibrator.

First, as shown in FIG. 7, rough crystal Lambert is sliced at a predetermined angle, to be a wafer S with a given thickness. Then, after lapping and crude processing of the wafer S (see FIGS. 9A to 9C), an affected layer is removed by etching and mirror polishing process such as polishing is performed to obtain the wafer S with a predetermined thickness (S10).

Next, an outer shape forming step for forming the outer shape of the plurality of piezoelectric plates 11 using the polished wafer S is performed (S20). In detail, by performing etching processing of an etching protection film (not shown) which is patterned on the outer shape of the piezoelectric plate 11 as a mask, it is possible to selectively remove a region which is not masked by the etching protection film to form the outer shape of the piezoelectric plates 11. The piezoelectric plates 11 are in a state of being coupled with the wafer S through a coupling portion (not shown) until a subsequent cutting step is performed.

Herein, an electrode layer forming step for laminating the underlying metal layer 18a and the finishing metal layer 18b on the outer surface of the plurality of the piezoelectric plates 11 to form the electrode layer 18 (the excitation electrodes 14, the leading-out electrodes 19 and 20, and the mounting electrodes 15 and 16) is performed (S30).

Figure 9A:
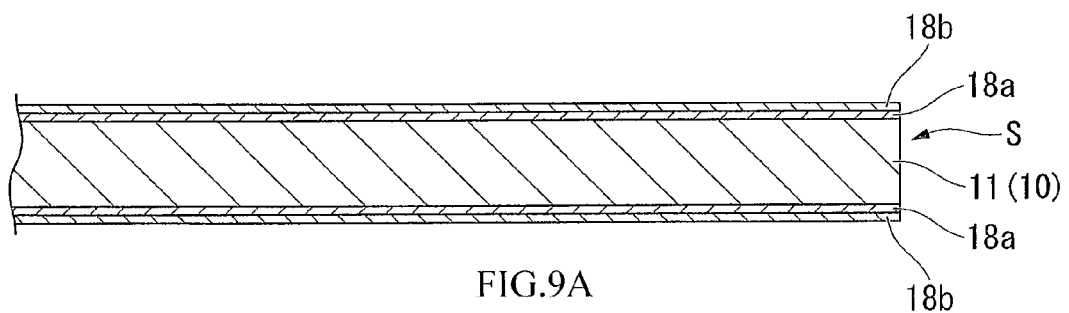
FIGS. 9A to 9C are flowcharts showing a method of manufacturing a piezoelectric vibrator and are cross-sectional views taken along line B-B of FIG. 2.
Figure 9B:
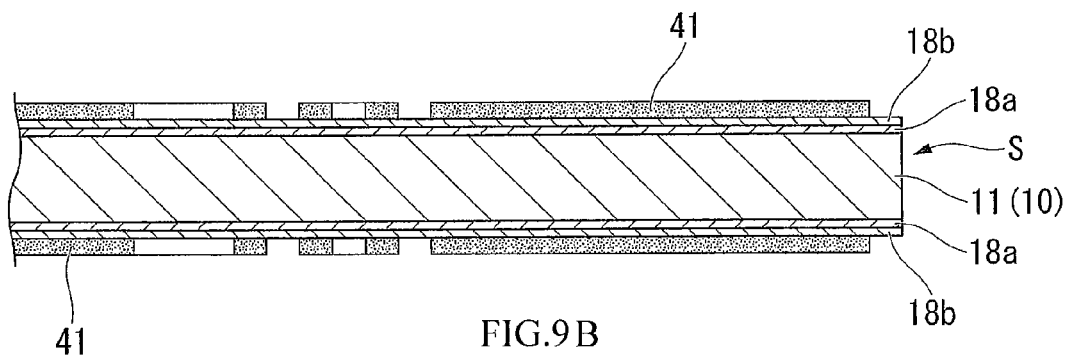

FIGS. 9A to 9B are flowcharts showing the method of manufacturing the piezoelectric vibrator, and are cross-sectional views taken along line B-B of FIG. 2.

First, as shown in FIG. 9A, the underlying metal layer 18a and the finishing metal layer 18b are formed on the piezoelectric plate 11 in order, by vapor deposition or sputtering (S31).

Figure 9C:
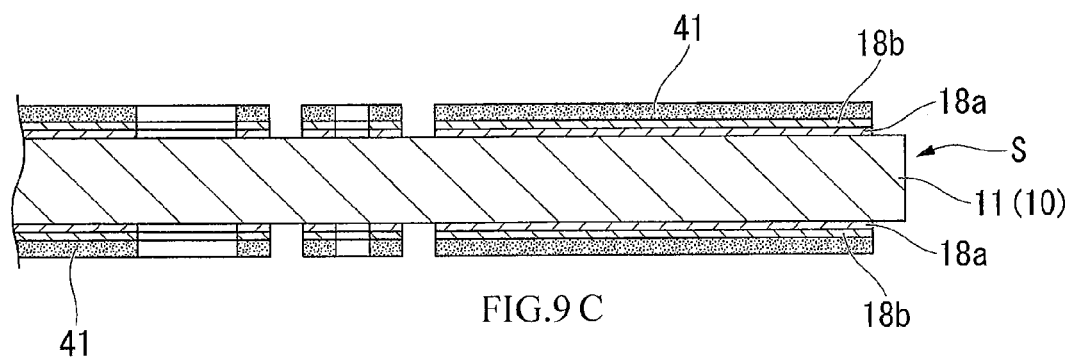

Next, as shown in FIG. 9B, a photoresist film 41 is formed by spray coating or the like, and then patterned by a photolithographic technique (S32). At this time, the formation region of the electrode layer 18 is patterned to be coated by the photoresist film 41. Then, as shown in FIG. 9C, an etching step for performing etching processing of the electrode layer 18 with the remaining photoresist film 41 as a mask is performed (S33). Accordingly, the electrode layer 18 (the excitation electrodes 14, the mounting electrodes 15 and 16, and the leading-out electrodes 19 and 20) which is obtained by laminating the underlying metal layer 18a and the finishing metal layer 18b is formed. At this time, in the base portion 10, the leading-out electrodes 19 and 20 are formed to be meandering along the width direction, and the mounting electrodes 15 and 16, and the leading-out electrodes 19 and 20 are patterned in a state of being electrically disconnected between both main surfaces of the base portion 10.

After that, the electrode layer forming step (S30) ends by removing the photoresist film 41.

Next, a cutting step for cutting the coupling portion which couples the wafer S and the piezoelectric vibrating piece 2 together and separating the plurality of piezoelectric vibrating pieces 2 from the wafer S to obtain individual pieces (S40). Accordingly, it is possible to manufacture the plurality of piezoelectric vibrating pieces 2 in which the electrode layer 18 (the excitation electrodes 14, the mounting electrodes 15 and 16, and the leading-out electrodes 19 and 20) is formed at a time from the wafer S.

Next, as shown in FIG. 8, an airtight terminal manufacturing step for manufacturing the plug 4 is performed (S60).

Then, a plating step for coating the plated layers on the outer surfaces of the lead terminals 31 of the plug 4 and the outer periphery of the stem 30 with the same material by a wet plating method is performed (S71).

As described above, by coating the plated layers 35 formed of the underlying film 35*a* and the finishing film 35*b* (see FIG. 5) on the lead terminals 31, it is possible to connect the inner leads 31*a* and the piezoelectric vibrating piece 2 to each other. In addition, since the plated layers 35 which are coated on the outer periphery of the stem 30 also has a property of elastic deformation, not only the connection of the piezoelectric vibrating piece 2, it is possible to perform cold welding of the stem 30 and the case 3 and to perform airtight joining to each other.

Then, a mounting step for joining the mounting electrodes 15 and 16 which are formed on one main surface (mounting surface) side of the piezoelectric vibrating piece 2 to the inner leads 31*a* is performed (S74). In detail, while heating the inner leads 31*a* at a temperature exceeding 300 degrees, the inner leads 31*a* and the piezoelectric vibrating piece 2 are superimposed on each other with a predetermined pressure. Accordingly, a tin lead plating having a high melting point which is the finishing film 35*b* of the inner leads 31*a* is dissolved and covers the upper portion of the mounting electrodes 15 and 16 (finishing metal layer 18*b*). Thus, it is possible to connect the inner leads 31*a* and the mounting electrodes 15 and 16. As a result, it is possible to mount the piezoelectric vibrating piece 2. That is, the piezoelectric vibrating piece 2 is in a state of being mechanically supported by the lead terminals 31 and being electrically connected to each other.

When connecting the inner leads 31*a* and the mounting electrodes 15 and 16, the mounting is performed by applying heat and pressure; however, the connection may be performed by using hot air or ultrasonic wave.

Herein, in the embodiment, since the leading-out electrodes 19 and 20 are formed to be meandering between the excitation electrodes 12 and 13 and the mounting electrodes 15 and 16, it is possible to prevent the diffusion of the joining member E to the vibrating arm portions 8 and 9 side through the leading-out electrodes 19 and 20.

Further, since the mounting electrodes 15 and 16, and the leading-out electrodes 19 and 20 are electrically disconnected between both main surfaces of the base portion 10, it is also possible to suppress the entering of the joining member E to the mounting surface and the main surface of the opposite side thereof through the side surface of the base portion 10.

Next, before performing a sealing step, a baking is performed at a predetermined temperature in order to prevent a distortion due to the mounting described above (S75).

Finally, a case pressing step for pressing the case 3 against the stem 30 so as to accommodate the mounted piezoelectric vibrating piece 2 in the inner portion thereof, and hermetically sealing the piezoelectric vibrating piece 2 (S76). In detail, the case 3 is pressed against the outer periphery of the stem 30 of the plug 4 while applying predetermined load in a vacuum. Then, since the metal film which is formed on the outer periphery of the stem 30 is elastically deformed, it is possible to perform airtight sealing by the cold welding. Accordingly, it is possible to enclose and seal the piezoelectric vibrating piece 2 in vacuum in the case 3.

In addition, before performing this step, it is preferable to sufficiently heat the piezoelectric vibrating piece 2, the case 3, and the plug 4 to eliminate adsorbed moisture or the like on the surfaces.

After completing the fixing of the case 3, screening is performed (S77). The screening is performed for realizing stabilization of the frequency or resonant resistance value, and for suppressing the generation of metal whisker due to compression stress to a press-fit portion into which the case 3 is pressed.

After completing the screening, an electric property inspection of the inner portion is performed (S78). Then, finally, the appearance inspection of the piezoelectric vibrator 1 is performed to finally check the dimensions or the quality. As a result, it is possible to manufacture the piezoelectric vibrator 1 shown in FIG. 1.

As described above, in the embodiment, the leading-out electrodes 19 and 20 have a configuration to be folded back several times between the excitation electrodes 12 and 13, and the mounting electrodes 15 and 16.

According to the configuration, it is possible to extend a distance of the leading-out electrodes 19 and 20 compared to a case of forming the leading-out electrodes 19 and 20 linearly between the excitation electrodes 12 and 13 and the mounting electrodes 15 and 16. Thus, although a material having high diffusibility on the mounting electrodes 15 and 16 is used for the joining member E, it is possible to suppress the diffusion of the joining member E to the vibrating arm portions 8 and 9 side through the leading-out electrodes 19 and 20.

In this case, since it is not necessary to pattern the electrode layer 18 several times, for example removing the finishing metal layer 18*b* in a portion other than the mounting electrodes 15 and 16 as in the related art, it is possible to suppress the diffusion of the joining member E while suppressing the increases of the number of manufacturing processes and the cost thereof. As a result, since the piezoelectric vibrating piece 2 can be strongly fixed while suppressing a fluctuation of a vibration frequency, it is possible to provide the piezoelectric vibrating piece 2 with excellent vibration characteristics and high reliability.

In addition, in the embodiment, since the leading-out electrodes 19 and 20 are formed to be meandering along the surface direction of the piezoelectric plate 11, specifically, the width direction, the patterning of the leading-out electrodes 19 and 20 can be easily performed at the same time as the patterning of other electrode layer 18.

Further, since the finishing metal layer 18*b* of the embodiment is formed of gold and the joining member E is formed of solder (tin lead plating with high melting point), the joining member E is appropriately diffused on the mounting electrodes 15 and 16 (finishing metal layer 18*b*). Accordingly, it is possible to strongly fix the piezoelectric vibrating piece 2 and the joining member E.

In the piezoelectric vibrator 1 of the embodiment, since the piezoelectric vibrating piece 2 described above is mounted on the plug 4 using the joining member E, it is possible to provide the piezoelectric vibrator 1 with excellent vibration characteristics and high reliability.

Oscillator

Next, an embodiment of the oscillator according to the present invention will be described with reference to FIG. 10.

Figure 10:
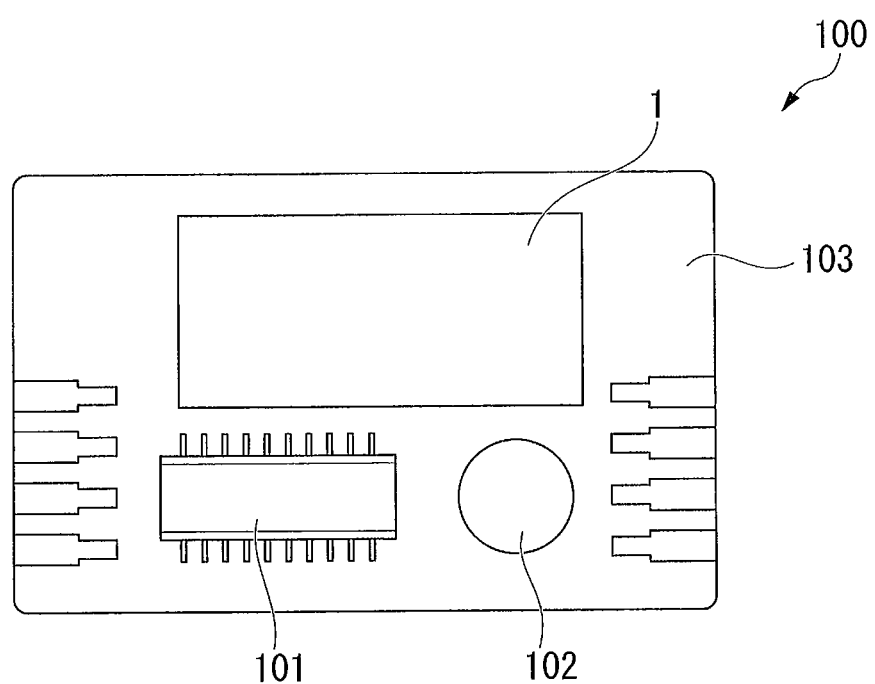
FIG. 10 is a view showing an embodiment of the present invention, and is a configuration view of an oscillator.

As shown in FIG. 10, the oscillator 100 of the embodiment is configured with the piezoelectric vibrator 1 as an oscillating piece which is electrically connected to an integrated circuit 101. The oscillator 100 includes a substrate 103 on which an electronic member 102 such as a capacitor is mounted. The integrated circuit 101 for the oscillator described above is mounted on the substrate 103 and the piezoelectric vibrator 1 is mounted on the vicinity of the integrated circuit 101. The electronic member 102, the integrated circuit 101, and the piezoelectric vibrator 1 are electrically connected to each other by wiring pattern (not shown). Each of configuration member is molded by resin (not shown).

In the oscillator 100 configured as described above, if voltage is applied to the piezoelectric vibrator 1, the piezoelectric vibrating piece 2 in the piezoelectric vibrator 1 vibrates. This vibration is converted into an electric signal by the piezoelectric characteristics of the piezoelectric vibrating piece 2, and is input to the integrated circuit 101 as the electric signal. The input electric signal is subjected to various processes by the integrated circuit 101 and is output as a frequency signal. Accordingly, the piezoelectric vibrator 1 functions as the oscillating piece.

In addition, by selectively setting the configuration of the integrated circuit 101 with an RTC (Real Time Clock) module or the like as necessary, it is possible to apply a function of controlling an operating date or time of the device and the external device in addition to the single-function oscillator for timepiece, or of providing time or a calendar.

As described above, according to the oscillator 100 of the embodiment, since the piezoelectric vibrator 1 with an excellent vibrating characteristics and high reliability is included, it is possible to provide the oscillator 100 which can obtain high quality with excellent characteristics and reliability and a stabilized frequency signal with high precision for a long period.

Electronic Device

Figure 11:
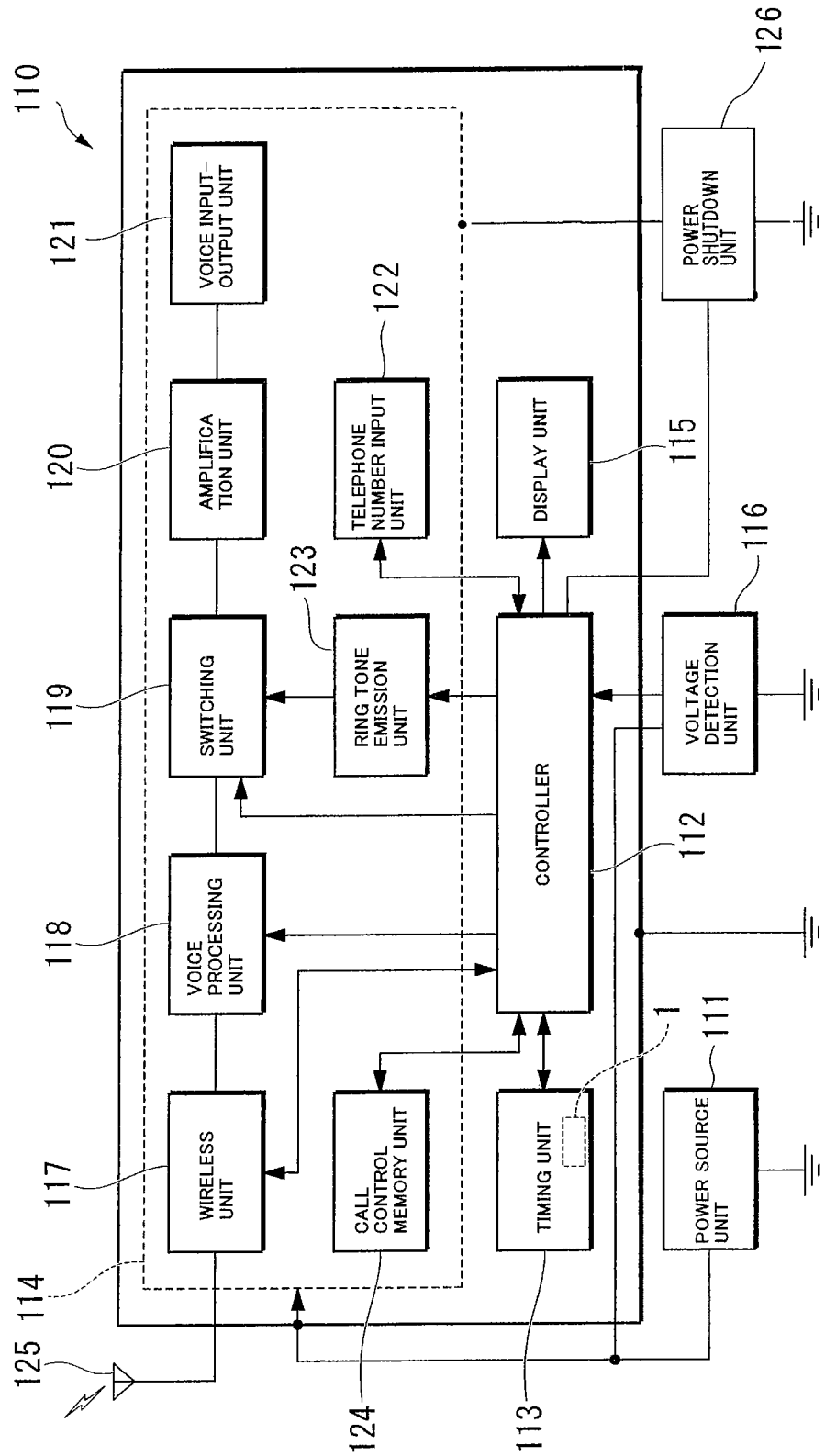
FIG. 11 is a view showing an embodiment of the present invention, and is a configuration view of an electronic device.

Next, an embodiment of an electronic device according to the present invention will be described with reference to FIG. 11. As the electronic device, a mobile information device 110 including the piezoelectric vibrator 1 described above will be described as an example. First, the mobile information device 110 of the embodiment is a representative of mobile phones, for example, and is obtained by developing and improving a watch of the related art. The appearance is similar to the watch, and it is possible to dispose a liquid crystal display on a portion corresponding to a dial plate and to display current time on the screen. In addition, when being used as a communication instrument, it is possible to perform the same communication as the mobile phone of the related art with a speaker and a microphone embedded in an inner side portion of a band by taking them from the wrist. However, the mobile information device is remarkably reduced in size and weight, compared to the mobile phone of the related art.

Next, a configuration of the mobile information device 110 of the embodiment will be described. As shown in FIG. 11, the mobile information device 110 includes the piezoelectric vibrator 1 and a power source unit 111 for supplying electricity. The power source unit 111 is formed of a lithium secondary battery, for example. In the power source unit 111, a control unit 112 which performs various controlling processes, a counter unit 113 which counts time or the like, a communication unit 114 which performs communication with the external portion, a display unit 115 which displays various items of information, and a voltage detection unit 116 which detects voltage of each functional unit are connected to each other in parallel. The electricity is supplied to each functional unit by the power source unit 111.

The control unit 112 controls each functional unit to perform the operation control of entire system such as transmission and reception of voice data, measurement or display of the current time, and the like. In addition, the control unit 112 includes a ROM in which a program is written in advance, a CPU which reads out and executes the written program in the ROM, a RAM which is used as a work area of the CPU, and the like.

The counter unit 113 includes the integrated circuit in which an oscillating circuit, a register circuit, a counter circuit, and an interface circuit are embedded, and the piezoelectric vibrator 1. If the voltage is applied to the piezoelectric vibrator 1, the piezoelectric vibrating piece 2 vibrates, and the vibration is converted into an electric signal due to the piezoelectric characteristics included in the crystal to be input to the oscillating circuit as the electric signal. The output of the oscillating circuit is two-valued, and counted by the register circuit and the counter circuit. Then, the transmission and reception of the signal to and from the control unit 112 is performed through the interface circuit, and the current time, current date, or the calendar information is displayed on the display unit 115.

The communication unit 114 includes the same function as the mobile phone of the related art, and includes a wireless unit 117, a voice processing unit 118, a switching unit 119, an amplification unit 120, a voice input and output unit 121, a phone number input unit 122, a ringtone generation unit 123, and a call control memory unit 124.

The wireless unit 117 performs the transmission and reception of various data items such as voice data to and from the base station through an antenna 125. The voice processing unit 118 encodes and decodes the voice signal input from the wireless unit 117 or the amplification unit 120. The amplification unit 120 amplifies the signal input from the voice processing unit 118 or the voice input and output unit 121, to a predetermined level. The voice input and output unit 121 is formed of a speaker, a microphone and the like, and amplifies the ringtone and voice from the receiver or collects the sound.

In addition, the ringtone generation unit 123 generates a ringtone according to a call from the base station. Since the switching unit 119 switches the amplification unit 120 which is connected to the voice processing unit 118 to the ringtone generation unit 123 only when receiving a call, the ringtone generated in the ringtone generation unit 123 is output to the voice input and output unit 121 through the amplification unit 120.

Further, the call control memory unit 124 accommodates a program relating to sending and receiving control of the communication. In addition, the phone number input unit 122 includes numeric keypads from 0 to 9 and other keypads, for example, and by pressing the numeric keypads and the like, phone numbers of the called party are input.

When the voltage applied with respect to each functional unit such as the control unit 112 by the power source unit 111 does not reach a predetermined value, the voltage detection unit 116 detects the voltage drop and notifies it to the control unit 112. The predetermined voltage value at this time is a value which is previously set as the minimum voltage necessary for stabilized operation of the communication unit 114, and is about 3 V, for example. The control unit 112 which received a notification of the voltage drop from the voltage detection unit 116, inhibits the operations of the wireless unit 117, the voice processing unit 118, the switching unit 119, and the ringtone generation unit 123. In particular, it is necessary to inhibit the operation of the wireless unit 117 which requires a measurable amount of power. Further, the display unit 115 displays that the communication unit 114 cannot function due to a low remaining battery level.

That is, the voltage detection unit 116 and the control unit 112 can inhibit the operation of the communication unit 114 and display the notice on the display unit 115. The display may be a text message, or may be an x mark on a phone icon displayed on an upper portion of a display surface of the display unit 115, as further intuitive display.

Since a power-off unit 126 which can selectively turn off the power of a portion regarding to the function of the communication unit 114 is included, it is possible to reliably stop the function of the communication unit 114.

As described above, according to the mobile information device 110 of the embodiment, since the piezoelectric vibrator 1 with an excellent vibrating characteristics and high reliability is included, it is possible to provide the mobile information device 110 which can obtain high quality with excellent characteristics and reliability and which can display timepiece information with high precision which is stabilized for a long period.

Radio-Controlled Timepiece

Next, one embodiment of a radio-controlled timepiece according to the present invention will be described with reference to FIG. 12.

Figure 12:
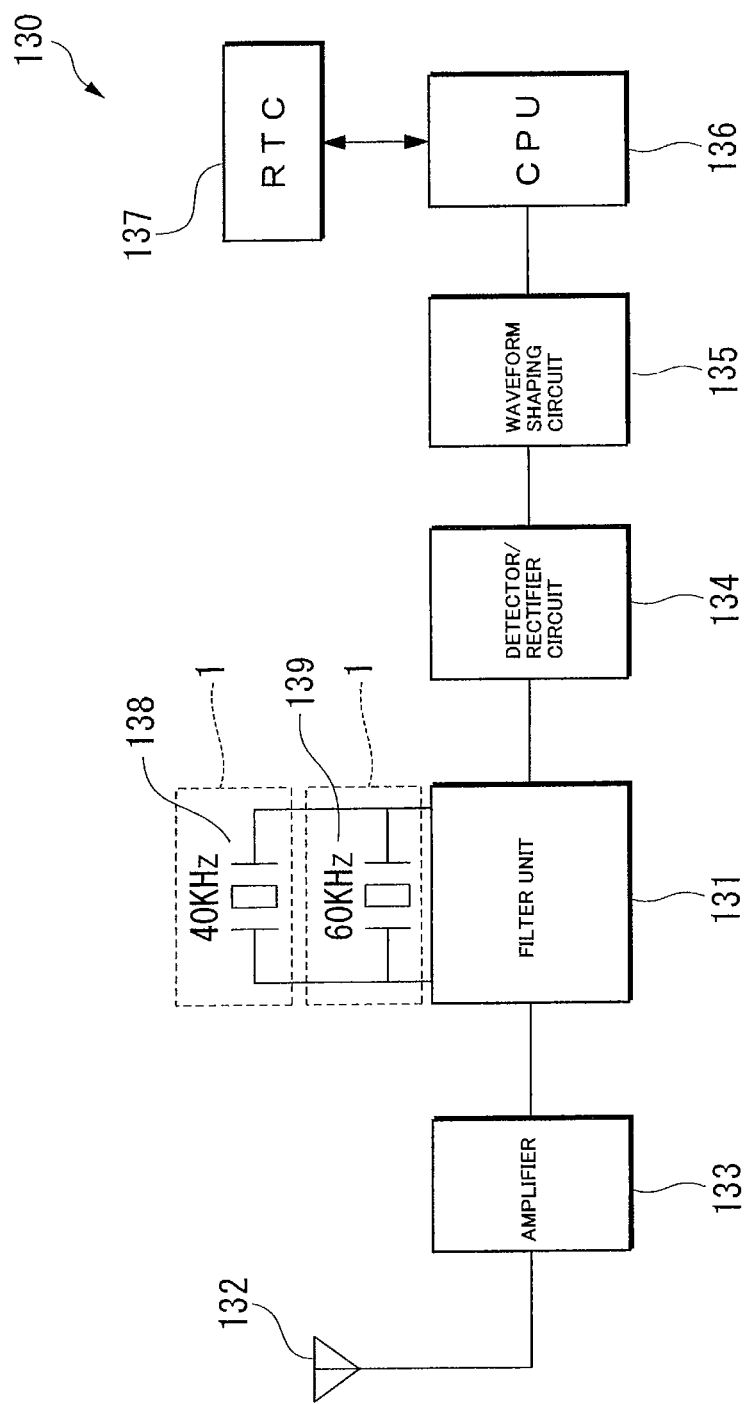
FIG. 12 is a view showing an embodiment of the present invention, and is a configuration view of a radio-controlled timepiece.

As shown in FIG. 12, a radio-controlled timepiece 130 of the embodiment includes the piezoelectric vibrator 1 which is electrically connected to a filter unit 131, and is a timepiece which includes a function of receiving standard radio waves including timepiece information and of automatically correcting and displaying the correct time.

Transmitting stations (transmitter stations) which transmit the standard radio waves are in Fukushima-ken (40 kHz) and Saga-ken (60 kHz) in Japan, each of them transmits the standard radio waves. Since long waves such as 40 kHz or 60 kHz have both a property of ground-wave propagation and a property of propagation by reflection between the ionosphere and the ground, a propagation range is large and the two transmitting stations described above provide full coverage of Japan.

Hereinafter, a functional configuration of the radio-controlled timepiece 130 will be described in detail.

An antenna 132 receives the standard radio waves of long waves of 40 kHz or 60 kHz. The standard long wave is obtained by applying amplitude modulation to time information which is called time code to carrier wave of 40 kHz or 60 kHz. The received standard long wave is amplified by an amplifier 133 and is filtered and synchronized by the filter unit 131 including the plurality of piezoelectric vibrators 1.

The piezoelectric vibrator 1 of the embodiment includes crystal vibrator units 138 and 139 which include resonance frequencies of 40 kHz and 60 kHz which is the same as the carrier frequency described above.

Further, the filtered signal of the predetermined frequency is detected and demodulated by a rectification circuit 134. Then, the time code is extracted through a waveform shaping circuit 135 and counted in a CPU 136. In the CPU 136, information regarding the current year, date, day, time, and the like is read. The read information is reflected in an RTC 137, and the proper time information is displayed.

Since the carrier wave is 40 kHz or 60 kHz, the vibrator having a tuning fork type structure described above is suitable for the crystal vibrator units 138 and 139.

In addition, the description above is described with Japan as an example; however, the frequencies of the standard long wave are different for every country. For example, the standard radio wave of 77.5 kHz is used in Germany. Accordingly, when the radio-controlled timepiece 130 which can be used overseas is embedded in a mobile device, another piezoelectric vibrator 1 with other frequencies which are different from those in Japan is necessary.

As described above, according to the radio-controlled timepiece 130 of the embodiment, since the piezoelectric vibrator 1 with an excellent vibrating characteristics and high reliability is included, it is possible to provide the radio-controlled timepiece 130 which can obtain high quality with excellent characteristics and reliability and which can stably count time with high precision for a long period.

Hereinafter, the embodiments of the present invention have been described with reference to the drawings, however the detailed configurations are not limited to the embodiments and the design thereof can be changed over a range without departing from the scope of the present invention.

For example, in the embodiments described above, the cylinder package type or the surface-mounted type piezoelectric vibrator 1 has been described as an example of the piezoelectric vibrator, however, it is not limited to the piezoelectric vibrator 1. For example, a ceramic package type piezoelectric vibrator or a surface-mounted type vibrator which is obtained by fixing the cylinder package type piezoelectric vibrator 1 in a mold resin unit can be used.

In the embodiments described above, the case in which the tin lead plating with a high melting point which is formed on the outer periphery surface of the inner leads 31a is dissolved to join the inner leads 31a and the mounting electrodes 15 and 16 has been described, however, a bump (joining member) which is formed of a solder or the like for joining the inner leads 31a and the mounting electrodes 15 and 16, may be provided between thereof to join them together. In addition, not only the solder, but also various materials such as gold and the like can be applied as the joining member E.

Further, in the embodiments described above, the case in which the mounting electrodes 15 and 16 and the leading-out electrodes 19 and 20 with the same pattern are formed on the both main surfaces of the base portion 10 has been described, however, it is not limited thereto, and the mounting electrodes 15 and 16 and the leading-out electrodes 19 and 20 may be used as long as they are formed on the mounting surface side.

Figure 13:
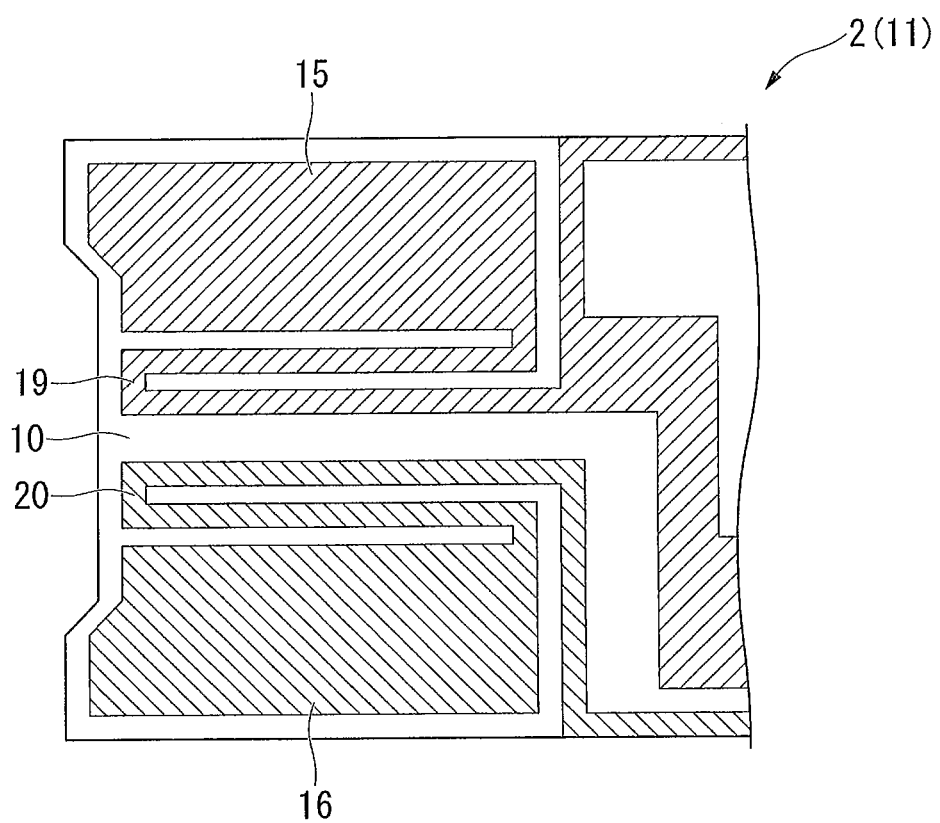
FIG. 13 is a view showing another configuration of a piezoelectric vibrating piece and is an enlarged plan view of a base portion.

In the embodiments described above, the case in which the leading-out electrodes 19 and 20 are meandering along the width direction has been described, however, it is not limited thereto, and the leading-out electrodes 19 and 20 may be used as long as the leading-out electrodes are folded back several times between the mounting electrodes 15 and 16, and the excitation electrodes 12 and 13. In detail, as shown in FIG. 13, the leading-out electrodes 19 and 20 may be formed so as to extend towards the inner side along the width direction while meandering along the length direction thereof.

In addition, the design of leading-out electrodes 19 and 20 can be appropriately changed, for example, by forming in a whorl shape which surrounds the outer side of the mounting electrodes 15 and 16.

Figure 14A:
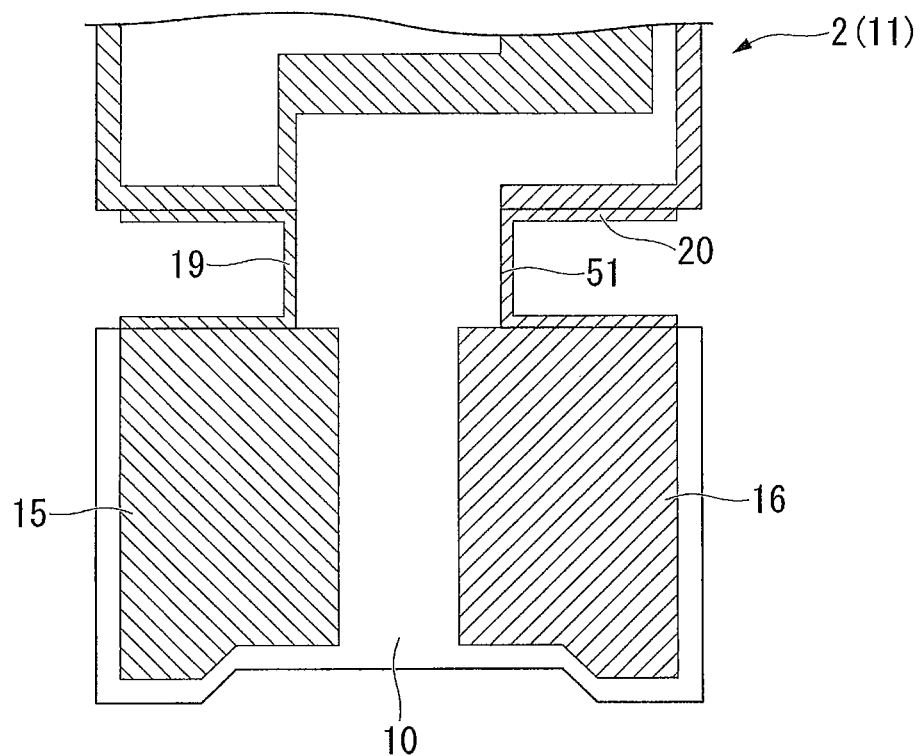
Figure 14B:
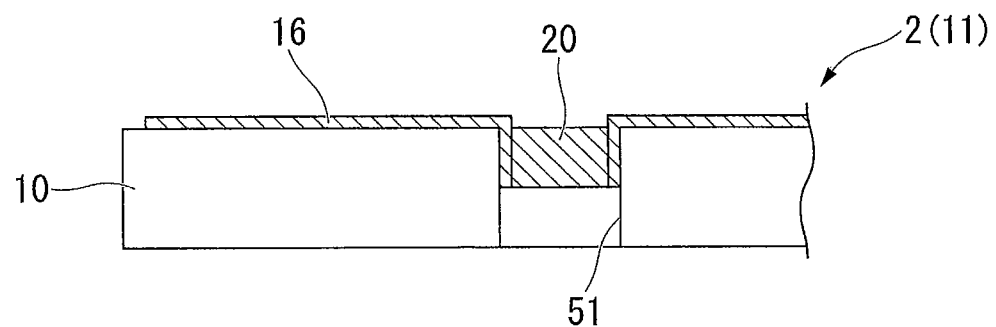
Figure 15A:
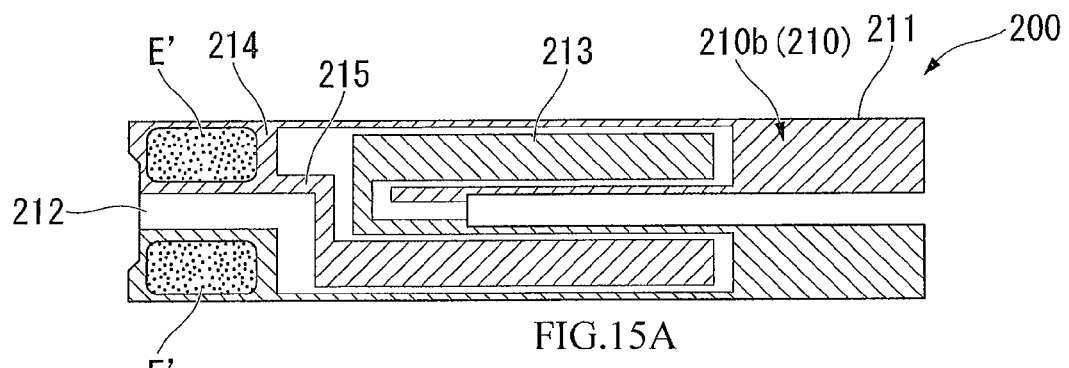
FIGS. 15A and 15B are plan views showing a piezoelectric vibrating piece of the related art.
Figure 15B:
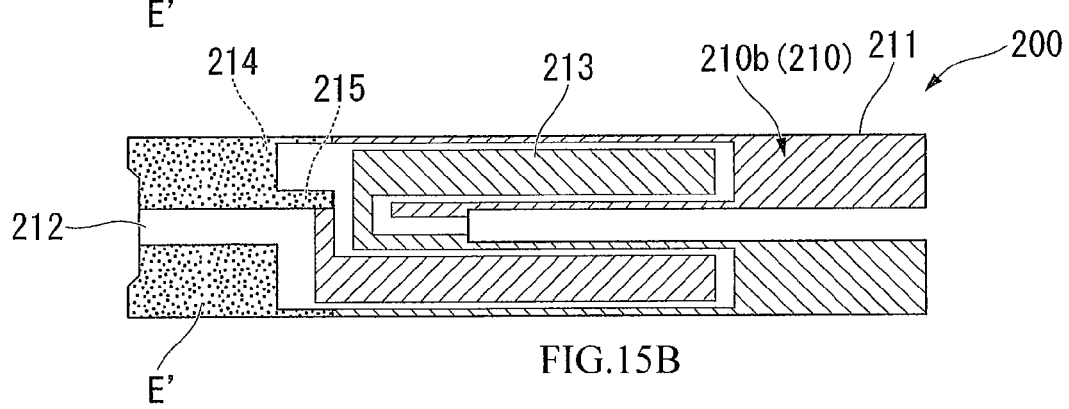
Figure 16A:
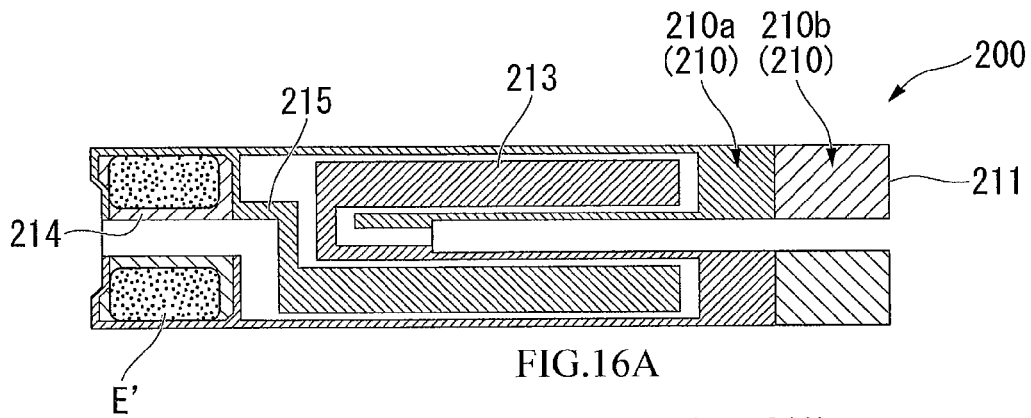
FIGS. 16A and 16B are plan views showing a piezoelectric vibrating piece of the related art.
Figure 16B:
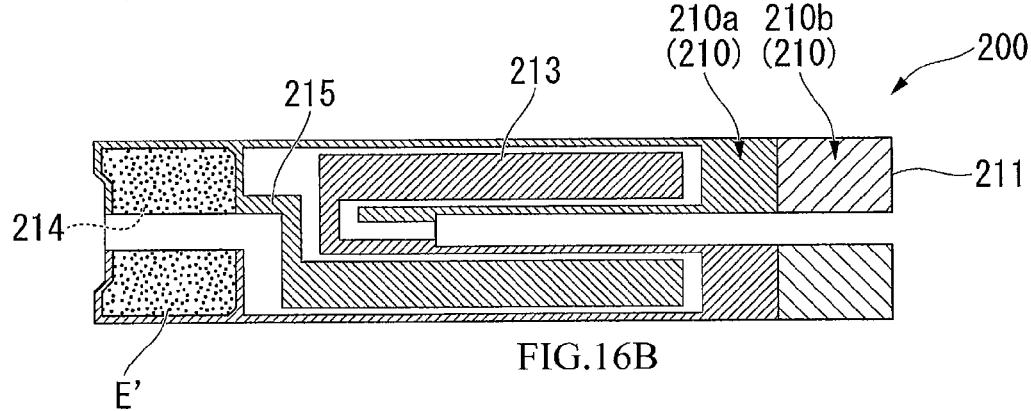

In addition, in the embodiments described above, the configuration of the leading-out electrodes 19 and 20 which are meandering along the surface direction of the piezoelectric plate 11 has been described, however, it is not limited thereto, and the leading-out electrodes may be meandering along the thickness direction of the piezoelectric plate 11. In detail, in the piezoelectric vibrating piece 2 shown in FIG. 14, a pair of cut-out portions 51 which penetrate in the thickness direction and open towards the outer side of the width direction are provided in the center portion along the length direction of the base portion 10. Accordingly, the portion of the base portion 10 on which the cut-out portions 51 are formed is formed in a curved shape which is referred to as a narrow width portion having a narrower width compared to other portions.

In the modification examples, the mounting electrodes 15 and 16 are formed on the base end side with respect to the cut-out portions 51 of the base portion 10, and the leading-out electrodes 19 and 20 are formed in the inner surface of the cut-out portions 51. After being folded back along the thickness direction from the distal end portions of the mounting electrodes 15 and 16, the leading-out electrodes 19 and 20 extend towards the distal end side along the inner surface of the cut-out portions 51 and the distal end portions thereof are connected to the base end portion of the excitation electrodes 12 and 13.

According to the configuration, since the route through which the vibration excited by the vibrating arm portions 8 and 9 propagates to the base portion 10 side can be narrower than the narrow width portion formed by the cut-out portions 51, the vibration is kept in the vibrating arm portions 8 and 9 side to easily suppress a leakage thereof to the base portion 10 side. Accordingly, it is possible to effectively suppress vibration leakage, to suppress an increase of a CI value, and to suppress a decrease of quality of an output signal.

In addition, since the leading-out electrodes 19 and 20 are formed in the inner surface of the cut-out portions 51, and it is possible to extend a distance of the leading-out electrodes 19 and 20 compared to a case of forming the leading-out electrodes 19 and 20 linearly between the excitation electrodes 12 and 13, and the mounting electrodes 15 and 16, it is possible to suppress the diffusion of the joining member E to the vibrating arm portions 8 and 9 side. The leading-out electrodes 19 and 20 may be folded back in the width direction, the length direction, and the thickness direction, respectively.

In addition, the constituent elements of the embodiments described above can be appropriately switched to the known constituent elements and may be appropriately combined with the modification examples described above, in a range not departing a scope of the present invention.

What is claimed is:

1. A piezoelectric vibrating piece comprising:
   a piezoelectric plate that includes a pair of vibrating arm portions, and a base portion that integrally connects base ends of the pair of vibrating arm portions along a length direction;
   excitation electrodes on the vibrating arm portions and configured to vibrate the vibrating arm portions;
   mounting electrodes on the base portion including a joining member that connects the piezoelectric plate to lead terminals; and
   lead-out electrodes connecting the excitation electrodes and the mounting electrodes,
   wherein the lead-out electrodes are configured in a serpentine pattern between the excitation electrodes and the mounting electrodes.

2. The piezoelectric vibrating piece according to claim 1, wherein the piezoelectric plate includes a cut-out portion in a periphery of the piezoelectric plate in a thickness direction of the piezoelectric plate, and wherein the lead-out electrodes are configured on an inner surface of the cut-out portion.

3. The piezoelectric vibrating piece according to claim 1, wherein the mounting electrodes comprise gold, and the joining member comprises solder.

4. A piezoelectric vibrator including the piezoelectric vibrating piece according to claim 1, wherein the mounting electrodes of the piezoelectric vibrating piece are mounted on a package by the lead terminals.

5. An oscillator including the piezoelectric vibrator according to claim 4 electrically connected to an integrated circuit as an oscillating piece.

6. An electronic device including the piezoelectric vibrator according to claim 4 electrically connected to a counter portion.

7. A radio-controlled timepiece including the piezoelectric vibrator according to claim 4 electrically connected to a filter portion.

* * * * *